United States Patent
Anderson et al.

(10) Patent No.: US 9,673,055 B2
(45) Date of Patent: Jun. 6, 2017

(54) METHOD FOR QUADRUPLE FREQUENCY FINFETS WITH SINGLE-FIN REMOVAL

(71) Applicant: GLOBALFOUNDRIES INC., Grand Cayman (KY)

(72) Inventors: Brent A. Anderson, Jericho, VT (US); Andres Bryant, Burlington, VT (US); Edward J. Nowak, Essex Junction, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 137 days.

(21) Appl. No.: 14/613,416

(22) Filed: Feb. 4, 2015

(65) Prior Publication Data
US 2016/0225634 A1 Aug. 4, 2016

(51) Int. Cl.
| | |
|---|---|
| *H01L 21/308* | (2006.01) |
| *H01L 21/8234* | (2006.01) |
| *H01L 21/8238* | (2006.01) |
| *H01L 21/84* | (2006.01) |
| *H01L 27/12* | (2006.01) |

(52) U.S. Cl.
CPC .. *H01L 21/3086* (2013.01); *H01L 21/823431* (2013.01); *H01L 21/823821* (2013.01); *H01L 21/845* (2013.01); *H01L 27/1211* (2013.01)

(58) Field of Classification Search
CPC ......... H01L 21/3086; H01L 21/823431; H01L 21/823821; H01L 21/845
See application file for complete search history.

(56) References Cited

U.S. PATENT DOCUMENTS

| | | | |
|---|---|---|---|
| 6,875,703 B1 | 4/2005 | Furukawa et al. | |
| 7,183,142 B2 * | 2/2007 | Anderson | H01L 29/785 257/E27.112 |
| 7,351,666 B2 | 4/2008 | Furukawa et al. | |
| 7,651,951 B2 | 1/2010 | Tran et al. | |
| 7,790,531 B2 | 9/2010 | Tran | |
| 8,012,674 B2 | 9/2011 | Fischer et al. | |
| 8,026,179 B2 | 9/2011 | Lue | |
| 8,242,022 B2 | 8/2012 | Kim | |

(Continued)

OTHER PUBLICATIONS

Bergendahl et al., "Sub-Lithographic Semiconductor Structures with Non-Constant Pitch," U.S. Appl. No. 13/659,318, filed Oct. 24, 2012.

(Continued)

*Primary Examiner* — Errol Fernandes
(74) *Attorney, Agent, or Firm* — Gibb & Riley, LLC; Michael J. LeStrange, Esq.

(57) ABSTRACT

A method of single-fin removal for quadruple density fins. A first double density pattern of first sidewall spacers is produced on a semiconductor substrate from first mandrels formed by a first mask using a minimum pitch. A second double density pattern of second sidewall spacers is produced on a layer disposed above the first double density pattern from second mandrels formed by a second mask with a the minimum pitch that is shifted relative to the first mask. A single sidewall spacer is removed from either the first or second double density pattern of first and second sidewall spacers. Sidewall image transfer processes allow the formation of quadruple density fins from which but a single fin is removed.

13 Claims, 11 Drawing Sheets

(56) References Cited

U.S. PATENT DOCUMENTS

| | | |
|---|---|---|
| 8,273,258 B2 | 9/2012 | Sone et al. |
| 8,691,697 B2 | 4/2014 | Booth, Jr. et al. |
| 2010/0170871 A1 | 7/2010 | Sone et al. |

OTHER PUBLICATIONS

Cheng et al., "Integration of Dense and Variable Pitch Fin Structures," U.S. Appl. No. 13/961,336, filed Aug. 7, 2013.

* cited by examiner

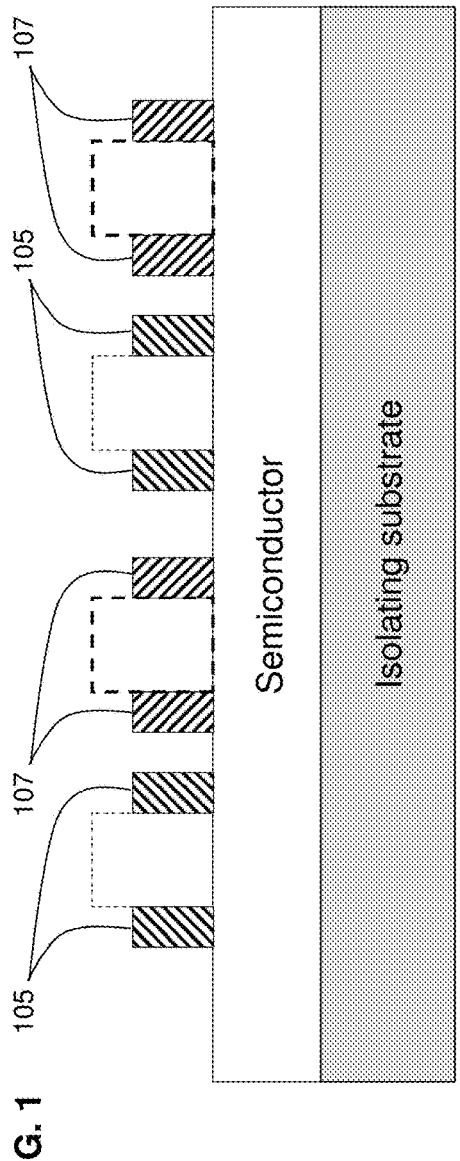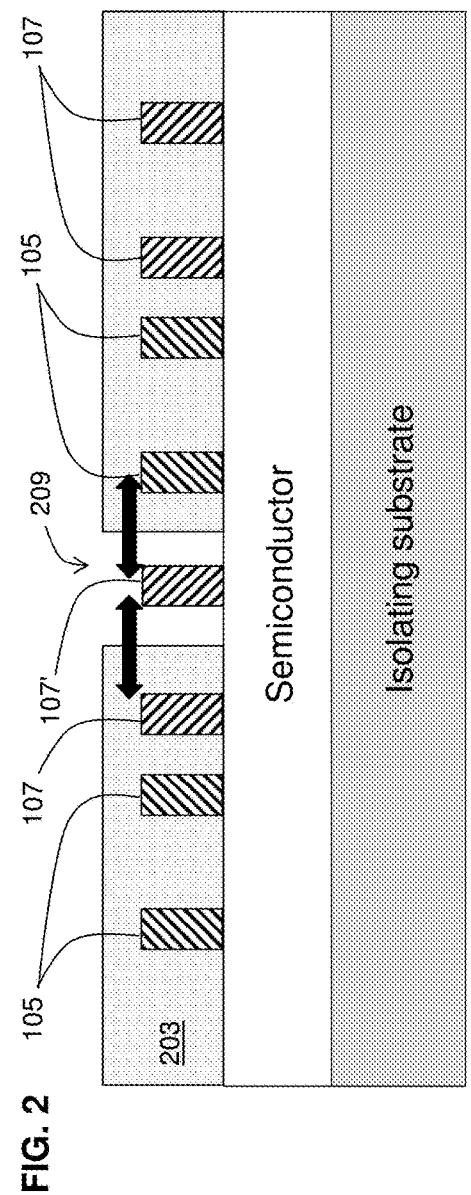

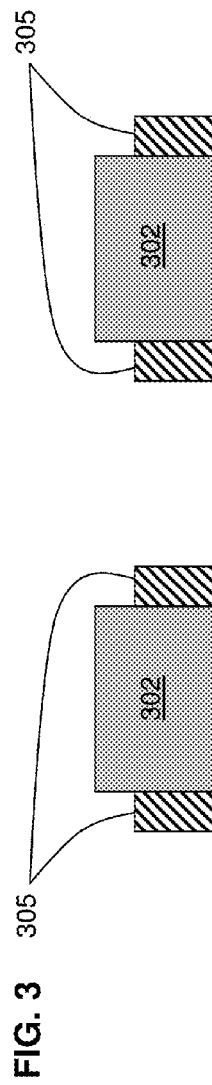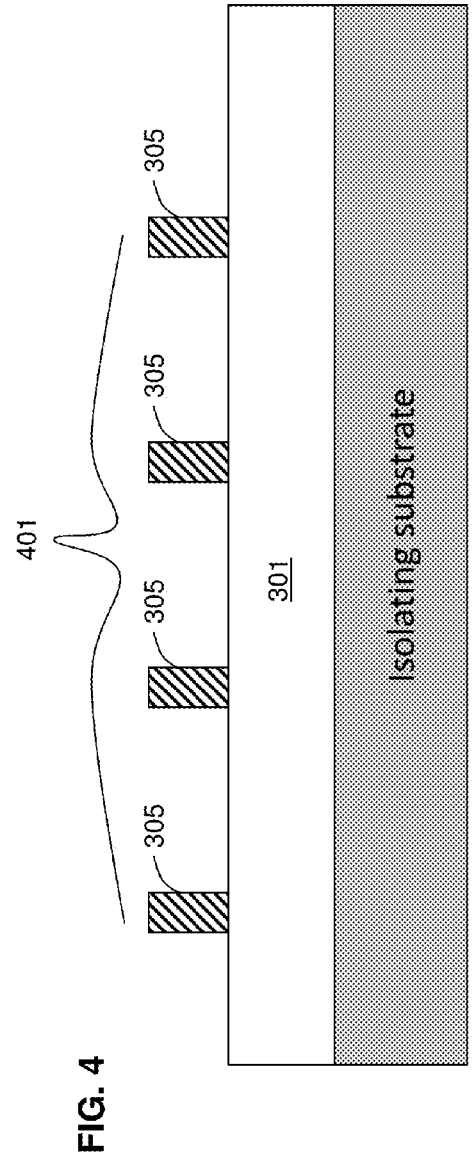

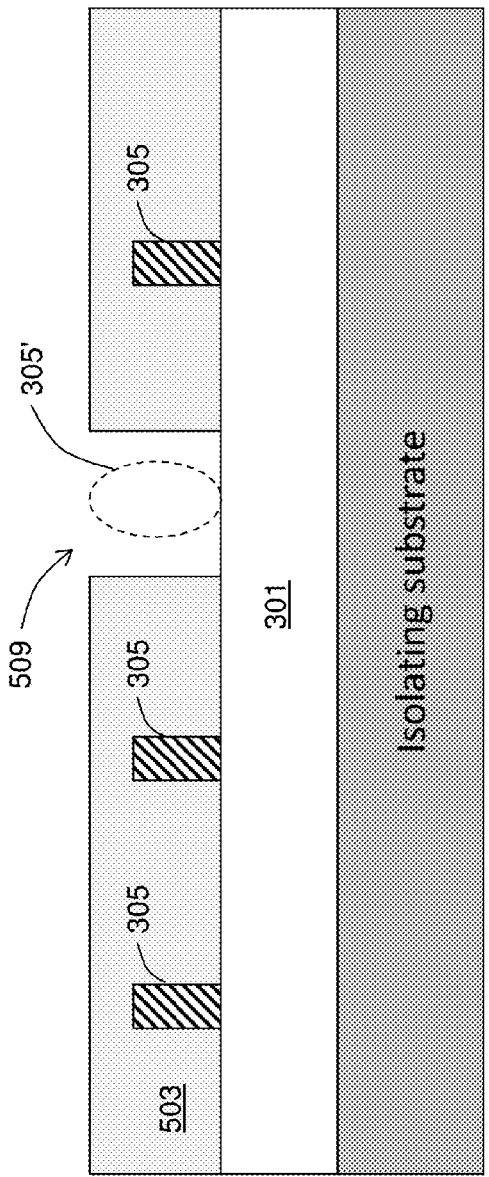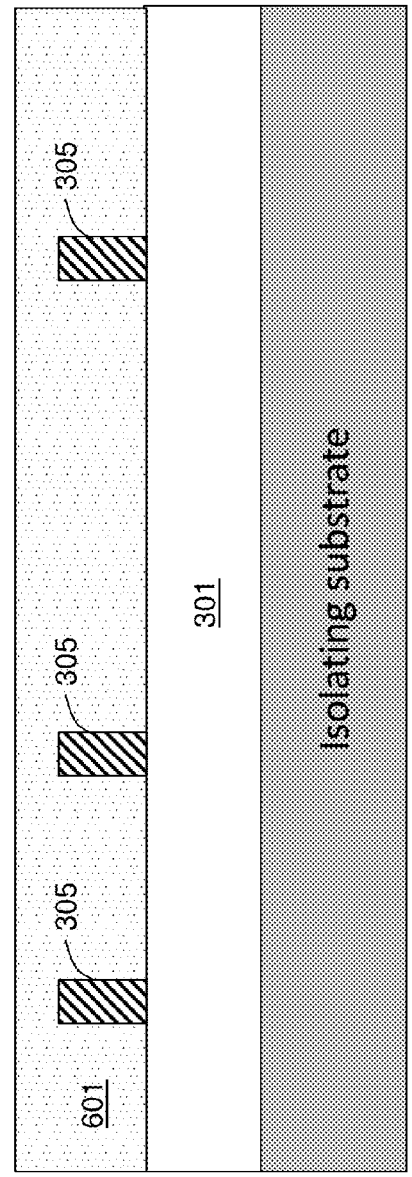
FIG. 5
FIG. 6

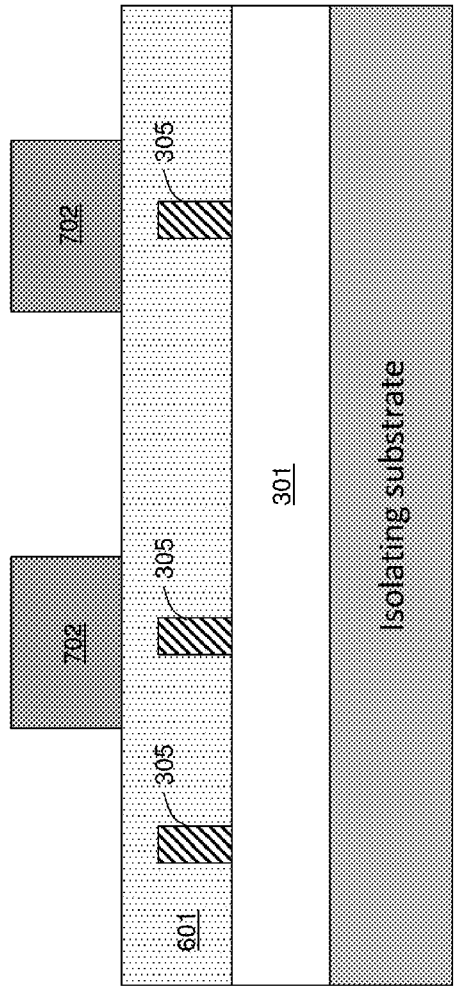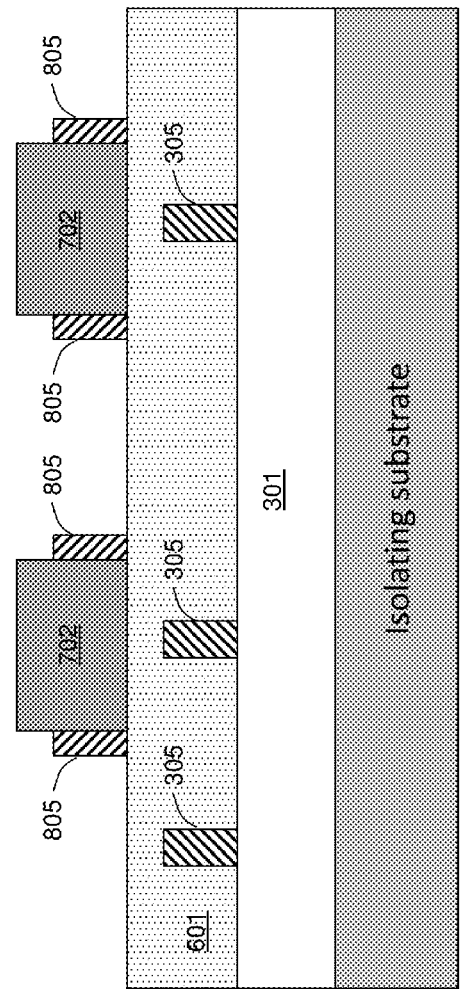

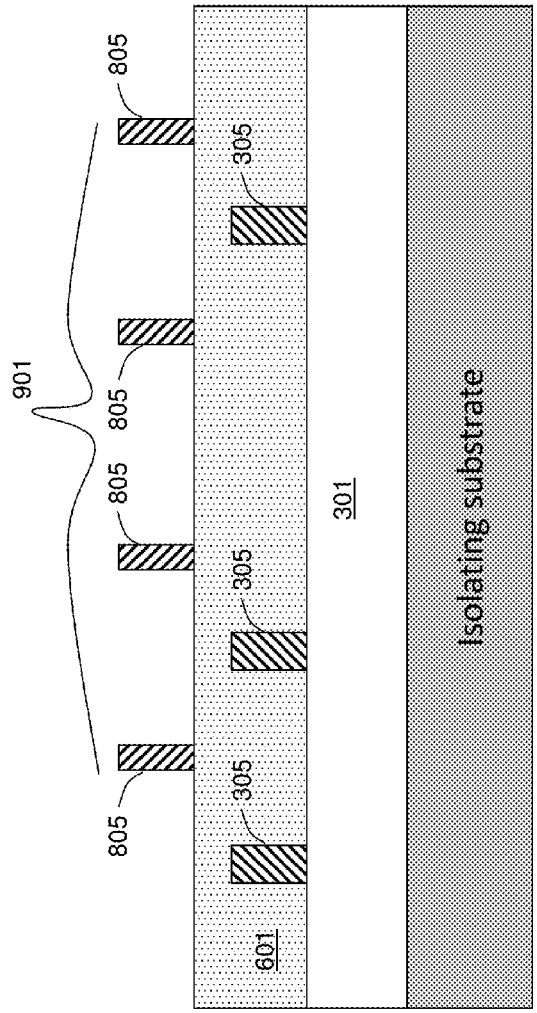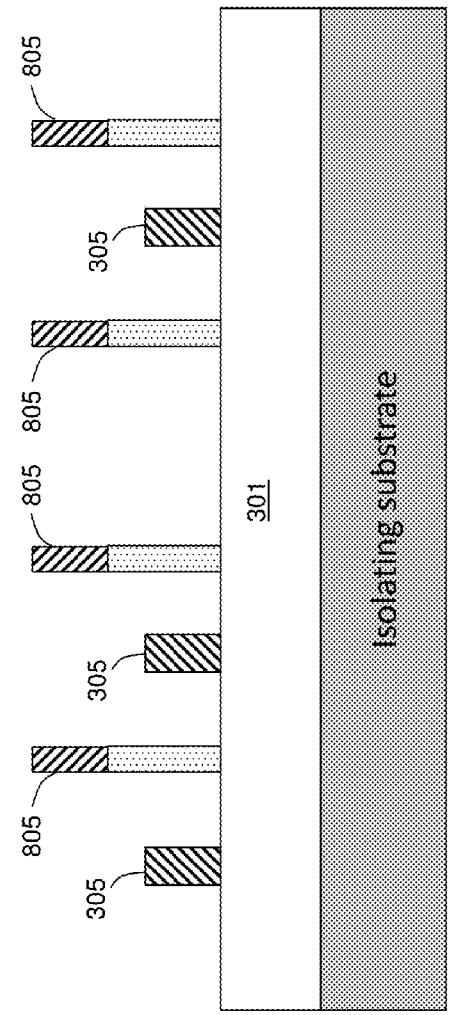

US 9,673,055 B2

METHOD FOR QUADRUPLE FREQUENCY FINFETS WITH SINGLE-FIN REMOVAL

BACKGROUND

The present disclosure relates to nanoscale fabrication of fin-type field effect transistors (FinFETs). Particularly, the present disclose relates to using sidewall image transfer (SIT) to fabricate quadruple frequency fins.

The continued reduction in feature sizes of complementary metal oxide semiconductor (CMOS) integrated circuits (ICs) requires ever greater accuracy in fabrication methods to form smaller features. Conventionally, photolithographic processes are used to fabricate the features of CMOS ICs. However, the resolution of photolithographic processes is limited by the wavelength of the light and the optics used in fabrication.

Spatial resolution is best described by the concept of pitch. Pitch is defined as the distance between identical points in two neighboring features, e.g., neighboring lines, in a repeating pattern of the IC. The two neighboring features are separated by a space, which may be filled by a material, e.g., an insulator. Pitch may also be defined as the sum of the width of a feature and the width of the space on one side of the feature. A particular photolithographic process is limited to a minimum pitch that precludes further reduction in feature size.

A particular photolithograph process is also characterized by a node technology in CMOS semiconductor device fabrication. For example, a 32 nm node technology, which typically uses deep ultraviolet (DUV) light, refers to the 32 nm average half-pitch between two identical points on neighboring features. Thus, the 32 nm node technology can reliably fabricate features, e.g., a space in a protective layer, having a half-pitch of 50 nm.

Frequency doubling, or pitch doubling by sidewall image transfer (SIT), is a well-known method of extending the capabilities of nanoscale fabrication beyond the limits of the minimum pitch of a photolithographic process to a "sub-photolithographic" pitch. In conventional SIT, a number of mandrels are first patterned above a semiconductor substrate by a photolithographic process using a near minimum pitch. A pair of sidewalls is then formed on the two sides of each mandrel, where the width of each sidewall is considerably less than the space between the mandrels. The mandrels are removed from between the pairs of sidewalls by selective etching, resulting in a number of sidewalls that is double the number of mandrels. Thus, a frequency doubling of the number sidewalls relative to the number of mandrels results within the near minimum pitch. The sidewalls are used to mask the underlying semiconductor substrate during a subsequent selective etch of the semiconductor substrate. After the masking sidewalls are removed, an average sub-photolithographic pitch equal to ½ of the near minimum pitch characterizes the semiconductor features.

To quadruple the number of semiconductor features within the near minimum pitch, it is only required to subject each of the original sidewalls to the formation of secondary sidewalls and to then remove the original sidewalls by selective etching. In this manner, a frequency quadrupling of the number of secondary sidewalls semiconductor occurs, whose pattern can then be transferred to the underlying semiconductor substrate, i.e., the frequency doubling method is applied twice to achieve frequency quadrupling of the semiconductor features.

Although the spatial resolution of photolithographic processes is of great importance, of equal importance is the accuracy of overlay. Overlay is a measure of the photolithography system's capability to print layers accurately on top of each other. Overlying features of layers or masks must be accurately aligned to the features of an underlying layer. Overlay is a measure of the accuracy of this alignment. The smaller the feature size, the more accurately one must align successive layers. For example, current photolithographic fabrication of a repeating semi-conductor feature having a 50 nm pitch requires an overlay accuracy of about 7 nm.

There remains a need for frequency quadrupling of the smaller features of a complementary metal oxide semiconductor (CMOS) integrated circuit (IC) that uses current photolithographic fabrication processes with an overlay that is scaled to the frequency quadrupling.

SUMMARY

In view of the foregoing, the disclosure may provide a method for single-fin removal from a quadruple frequency of fins of fin-type field effect transistors (FinFETs). The method may include forming first mandrels with a first mask of a minimum pitch on a semiconductor substrate. The method may also include forming first sidewall spacers on each side of each of the first mandrels and removing the first mandrels, where the first sidewall spacers have a double frequency of less than the minimum pitch. The method may further include removing a single first sidewall spacer from the first sidewall spacers by using a trim mask deposited over the first sidewall spacers, to leave remaining first sidewall spacers. The method may yet further include forming a protective layer over the remaining first sidewall spacers. The method may yet further include forming second mandrels with a second mask of the minimum pitch, whose alignment is shifted relative to the first mask, on the protective layer. The method may yet further include forming second sidewall spacers on each side of each of the second mandrels and removing the second mandrels, where the second sidewall spacers have the double frequency of less than the minimum pitch. The method may yet further include selectively etching exposed portions of the protective layer that are not masked by the second sidewall spacers in a first sidewall image transfer. Finally, the method may yet further include selectively etching exposed portions of the semiconductor substrate that are not masked by the remaining first sidewall spacers and the second sidewall spacers in a second sidewall image transfer, to form quadruple frequency fins with single-fin removal.

Another disclosure may also provide a method for single-fin removal from a quadruple frequency of fins of fin-type field effect transistors (FinFETs). The method may include forming first mandrels with a first mask of a minimum pitch on a semiconductor substrate. The method may also include forming first sidewall spacers on each side of each of the first mandrels and removing the first mandrels, where the first sidewall spacers have a double frequency of less than the minimum pitch. The method may further include forming a protective layer over the first sidewall spacers. The method may yet further include forming second mandrels with a second mask of the minimum pitch, whose alignment is shifted relative to the first mask, on the protective layer. The method may yet further include forming second sidewall spacers on each side of each of the second mandrels and removing the second mandrels, where the second sidewall spacers have the double frequency of less than the minimum pitch. The method may yet further include removing a single second sidewall spacer from the second sidewall spacers using a trim mask deposited over the second sidewall spacers, to leave remaining second sidewall spacers. The method may yet further include selectively etching exposed portions of the protective layer that are not masked by the remaining second sidewall spacers in a first sidewall image transfer. Finally, the method may include selectively etching exposed portions of the semiconductor substrate that are not masked by the first sidewall spacers and the remaining second sidewall spacers in a second sidewall image transfer, to form quadruple frequency fins with single-fin removal.

Yet another disclosure may further provide a method for single-fin removal from a quadruple frequency of fins of fin-type field effect transistors (FinFETs). The method may include forming first mandrels with a first mask of a minimum pitch on a semiconductor substrate. The method may also include forming first sidewall spacers on each side of each of the first mandrels and removing the first mandrels, where the first sidewall spacers have a double frequency of less than the minimum pitch. The method may further include performing one of: removing a single first sidewall spacer from the first sidewall spacers by a trim mask deposited over the first sidewall spacers to leave remaining first sidewall spacers, and forming a protective layer over the first sidewall spacers. If the method requires that the single first sidewall spacer be removed, then the method may yet further include: forming a protective layer over the remaining first sidewall spacers; forming second mandrels with a second mask of the minimum pitch, whose alignment is shifted relative to the first mask, on the protective layer; forming second sidewall spacers on each side of each of the second mandrels and removing the second mandrels, where the second sidewall spacers have the double frequency of less than the minimum pitch; selectively etching exposed portions of the protective layer that are not masked by the second sidewall spacers in a first sidewall image transfer; and selectively etching exposed portions of the semiconductor substrate that are not masked by the remaining first sidewall spacers and the second sidewall spacers in a second sidewall image transfer, to form quadruple frequency fins with single-fin removal. If the method requires that protective layer be formed over the first sidewall spacers, then the method may yet further include: forming second mandrels with a second mask of the minimum pitch, whose alignment is shifted relative to the first mask, on the protective layer; forming second sidewall spacers on each side of each of the second mandrels and removing the second mandrels, where the second sidewall spacers have the double frequency of less than the minimum pitch; removing a single second sidewall spacer from the second sidewall spacers using a trim mask deposited over the second sidewall spacers, to leave remaining second sidewall spacers; selectively etching exposed portions of the protective layer that are not masked by the remaining second sidewall spacers in a first sidewall image transfer; and selectively etching exposed portions of the semiconductor substrate that are not masked by the first sidewall spacers and the remaining second sidewall spacers in a second sidewall image transfer, to form quadruple frequency fins with single-fin removal.

BRIEF DESCRIPTION OF THE SEVERAL VIEWS OF THE DRAWINGS

The methods of the disclosure herein will be better understood from the following detailed description with reference to the drawings, which are not necessarily drawn to scale and in which:

FIG. 1 is a schematic diagram illustrating the fabrication of quadruple frequency sidewall spacers by two sidewall image transfers in the prior art;

FIG. 2 is a schematic diagram illustrating a problem of removing a single sidewall spacer from a quadruple frequency of sidewall spacers in the prior art;

FIG. 3 is a schematic diagram illustrating the formation of first mandrels by a first mask and of first sidewall spacers on each of the sides of each of the first mandrels formed on a semiconductor layer of embodiments herein;

FIG. 4 is a schematic diagram illustrating the removal of the first mandrels from between pairs of the first sidewall spacers of embodiments herein;

FIG. 5 is a schematic diagram illustrating the trimming of a single first sidewall spacer by a trim mask to leave remaining first sidewall spacers of embodiments herein;

FIG. 6 is a schematic illustrating the formation of a protective layer over the remaining first sidewall spacers of embodiments herein;

FIG. 7 is a schematic illustrating the formation of second mandrels by a second mask, shifted relative to the first mask, on the protective layer of embodiments herein;

FIG. 8 is a schematic diagram illustrating the formation of second sidewalls on each of the sides of each of the second mandrels of embodiments herein;

FIG. 9 is a schematic diagram illustrating the removal of the second mandrels between pairs of the second sidewall spacers of embodiments herein;

FIG. 10 is a schematic diagram illustrating the selective etching of exposed portions of the protective layer that are not masked by second sidewall spacers in a first sidewall image transfer of embodiments herein;

DETAILED DESCRIPTION

Figure 11:
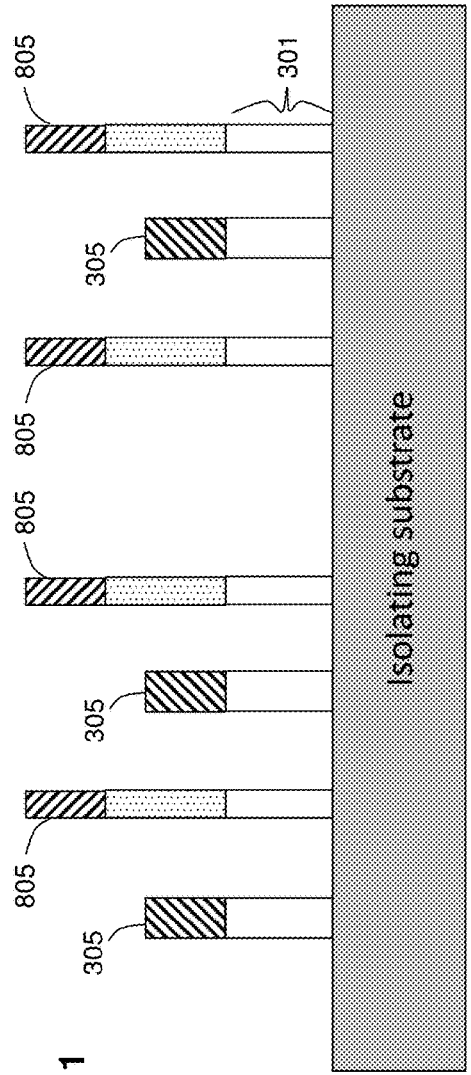
FIG. 11 is a schematic diagram illustrating the selective etching of exposed portions of the semiconductor substrate that are not masked by the remaining first sidewall spacers and the second sidewall spacers in a second sidewall image transfer, to form quadruple frequency fins with single-fin removal of embodiments herein.

The exemplary aspects of the disclosure and its various features and advantageous details are explained more fully with reference to the non-limiting exemplary aspects that are illustrated in the accompanying drawings and detailed in the following description. It should be noted that the features illustrated in the drawings are not necessarily drawn to scale. Descriptions of well-known materials, components, and processing techniques are omitted so as to not unnecessarily obscure the exemplary methods, systems, and products of the disclosure. The examples used herein are intended to merely facilitate an understanding of ways in which the exemplary aspects of the disclosure may be practiced and to further enable those of skill in the art to practice the exemplary aspects of the disclosure. Accordingly, the examples should not be construed as limiting the scope of the exemplary aspects of the disclosure.

As stated above, the disclosure may provide for frequency quadrupling of the smaller features of a complementary metal oxide semiconductor (CMOS) integrated circuit (IC) that uses current photolithographic fabrication processes with an overlay that is scaled to the frequency quadrupling.

Scaling beyond the 14 nm node technology for the fins of fin-type field effect transistors (FinFETs) is challenged by limited advances in photolithographic patterning. In particular, pitch and overlay are not expected to keep up with scaling demands for 10 nm and 7 nm node technologies, at least until advanced photolithographic tools, such as extreme ultraviolet (EUV), have matured. It is anticipated that for the 10 nm and 7 nm node technologies, fin pitch for FinFETs would scale to approximately, 35 nm and 25 nm, respectively.

Referring to FIG. 1, two sidewall image transfers (SIT) may produce frequency quadrupling of the sidewalls. Using a mask having a 100 nm pitch, a first pattern of pairs of first sidewall spacers 105 may be formed on each side of first mandrels (dashed line), which have a 50 nm pitch and are subsequently removed. A second mask, having a 100 nm pitch that is shifted 50 nm relative to the disposition of the first mask, may form a second pattern of pairs of second sidewall spacers 107 formed on each side of second mandrels (heavy dashed line), which also have a 50 nm pitch and are subsequently removed. If the second pattern of sidewall spacers 107 were superimposed upon the substrate of the first pattern of sidewall spacers 105, the resulting frequency quadrupling would result in sidewall spacers 105, 107 having an average pitch of 25 nm.

FIG. 2 illustrates a problem in removing a single second sidewall spacer 107 from the frequency quadrupled pattern of sidewall spacers 105, 107 having an average pitch of 25 nm. While trim mask 203 with a space 209, having a 7 nm overlay error, may be fabricated over a to-be-removed second sidewall spacer 107' using current photolithographic processes, overlay errors of the trim mask 203 to the left or right (double-headed arrows) may improperly protect the to-be-removed second sidewall spacer 107' and/or expose adjacent first sidewall spacers to subsequent removal. Thus, the average pitch of 25 nm of the pattern of sidewall spacers 105,107 requires an overlay error of less than ½×7 nm, i.e., about 3 nm, which is beyond the state of the art for current photolithographic processes using DUV. The identical problem exists in removing a single first sidewall spacer 105 from the frequency quadrupled pattern of first and second sidewall spacers 105, 107 having an average pitch of 25 nm.

FIG. 3 illustrates forming first sidewall spacers 305 on each side of each of first mandrel 302 formed above a semiconductor layer 301 in an exemplary method of forming quadruple frequency fins with single-fin removal. First mandrels 302 of a first material may be formed on the semiconductor layer 301 using a mask that has a minimum pitch, e.g., a 100 nm pitch with an overlay error of about 7 nm. An etch stop layer (not shown) may be formed on the semiconductor layer 301. The first material of the first mandrels 302 may, for example, comprise amorphous silicon (Si). First sidewall spacers 305 may comprise a second material that differs from the first material of the first mandrels 302 and may comprise, for example, $Si_3N_4$.

FIG. 4 illustrates the result of removing the first mandrels 302 from between the first sidewall spacers 305 to produce a frequency doubling of a first sidewall spacer pattern 401 having a less than minimum pitch, e.g., average pitch of 50 nm. Selective etching of the first material may remove the first mandrels 301, while the first sidewall spacers 305 of the second material are unaffected.

FIG. 5 illustrates a trim mask 503 that may be used to remove a single first sidewall spacer 305' (dashed oval) from the first sidewall spacer pattern 401 having, for example, an average pitch of 50 nm. Using current photolithographic processes, the trim mask 503 may protect the first sidewall spacer pattern 401 with the exception of a single first sidewall spacer 305' (dashed oval). The trim mask 503, having a 7 nm overlay error, may readily form a space 509 separating the single first sidewall spacer 305', which is to be trimmed, from adjacent first sidewall spacers. The single first sidewall spacer 305' may be removed by selective etching through the single space 509, resulting in a first sidewall spacer pattern 401 from which a single first sidewall 305' spacer has been removed, i.e., the remaining first sidewall spacers. The trim mask 503 may then be removed.

FIG. 6 illustrates a protective layer 601 that is formed over the first sidewall spacer pattern 401 from which a single first sidewall spacer 305' has been removed and the semiconductor substrate 301. The protective layer 601 may comprise a third material that differs from the second material of first sidewall spacers, e.g., the third material may, for example, comprise silicon dioxide ($SiO_2$).

FIG. 7 illustrates second mandrels 702 of the first material may be formed on the protective layer 601 using a second mask that has a minimum pitch, e.g., a 100 nm pitch, whose vertical alignment is shifted relative to the first mask by, for example, 50 nm. The second mask may have a less than minimum pitch, e.g., an average of 50 nm, with an overlay error of about 7 nm. An etch stop layer (not shown) may overlie the protective layer 601. The first material may differ from the third material of the protective layer 601 and may comprise amorphous silicon (Si).

FIG. 8 illustrates forming second sidewall spacers 805 of the second material on each side of each second mandrel 805. The second material of the second sidewall spacers 305 may differ from the first material of the second mandrels 802 and the third material of the protective layer 601 and may comprise $Si_3N_4$.

FIG. 9 illustrates selectively removing the second mandrels 802 from between the second sidewall spacers 805 to produce a second sidewall spacer pattern 901 having a double frequency with, for example, an average pitch of 50 nm. Selective etching of the first material may remove the second mandrels 301, while the second sidewall spacers 805 of the second material are unaffected.

FIG. 10 illustrates selectively etching the third material of the protective layer 601 using the second sidewall spacers 805 of the second material as a mask in a first sidewall image transfer. The first sidewall spacer pattern 401 of first sidewall spacers 305 may have a double frequency, but for the single first sidewall spacer 305', which has been removed. Similarly, the second sidewall spacer pattern 901 of second sidewall spacers 805 may have a double frequency with, for example, an average pitch of 50 nm, which has been interleaved with the first sidewall spacer pattern 401.

FIG. 11 illustrates selectively etching the semiconductor substrate 301 using the first and second sidewall spacers 305, 805 of the second material as a mask to effect a second sidewall image transfer of the first and second sidewall spacers 305, 805 to the semiconductor substrate 301. The resulting pattern of semiconductor 310 features, masked by the first and second sidewall spacers 305, 805, form a frequency quadrupled pattern of semiconductor 310 features having, for example, an average pitch of 25 nm, from which but one feature, corresponding to the single first sidewall spacer 305', was removed. Thus, the resulting pattern of semiconductor 301 features may comprise a pattern of quadruple frequency fins of FinFETs for a CMOS IC with single-fin removal.

Alternatively, by processes similar to those described above, a pattern of quadruple frequency fins of FinFETs for a CMOS IC, from which but a single second sidewall spacer 805 is removed, may also be formed.

Figure 12:
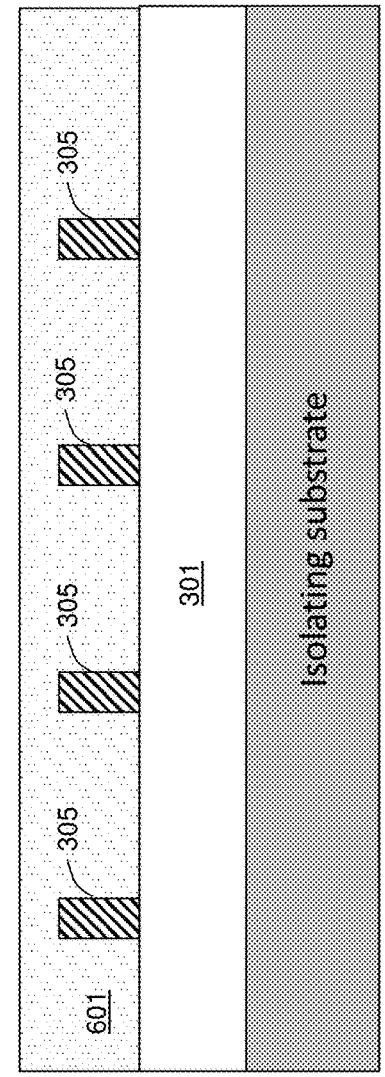
FIG. 12 is a schematic diagram illustrating a double frequency of first sidewall spacers formed on a semiconductor substrate that are covered by a protective layer of embodiments herein.

Referring to FIG. 4, the first pattern of first sidewall spacers 401, having a double frequency with, for example, an average pitch of 50 nm, may be covered by a protective layer 601, as shown in FIG. 12.

Figure 13:
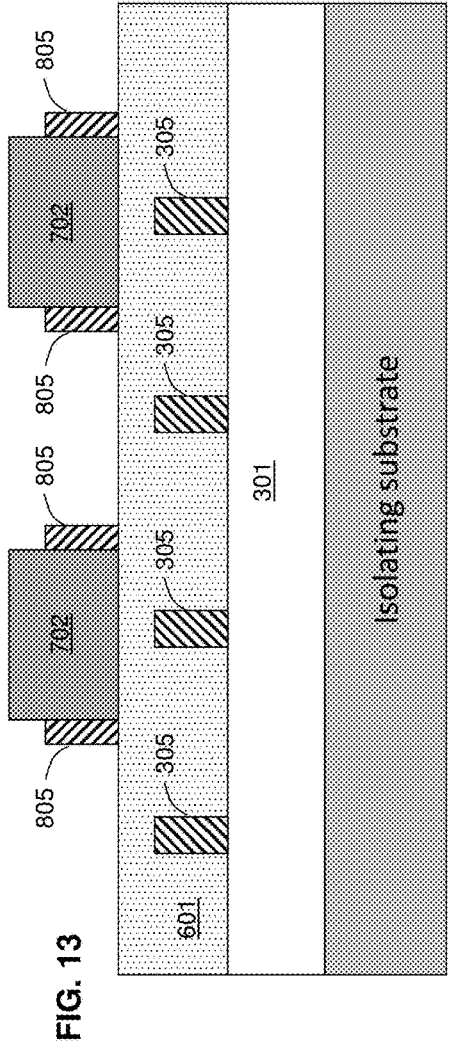
FIG. 13 is a schematic diagram illustrating the formation of second mandrels by a second mask, which is shifted relative to a first mask, and of second sidewall spacers on each of the sides of each of the second mandrels formed on the protective layer of embodiments herein.

FIG. 13 illustrates forming second mandrels 802 and second sidewall spacers 805 above a protective layer 601. Second mandrels 702 of a first material may be formed on the protective layer 601 using a second mask with a 100 nm pitch, whose vertical alignment is shifted relative to the first mask by, for example, 50 nm relative to the first mask. The second mask also has an overlay error of 7 nm. The first material of the second mandrels 702 may comprise amorphous Si. Second sidewall spacers 805 of a second material may be formed on each side of each second mandrel 702. The second material of the second sidewall spacers 805 differs from the first material of the second mandrels 802 and may comprise $Si_3N_4$.

Figure 14:
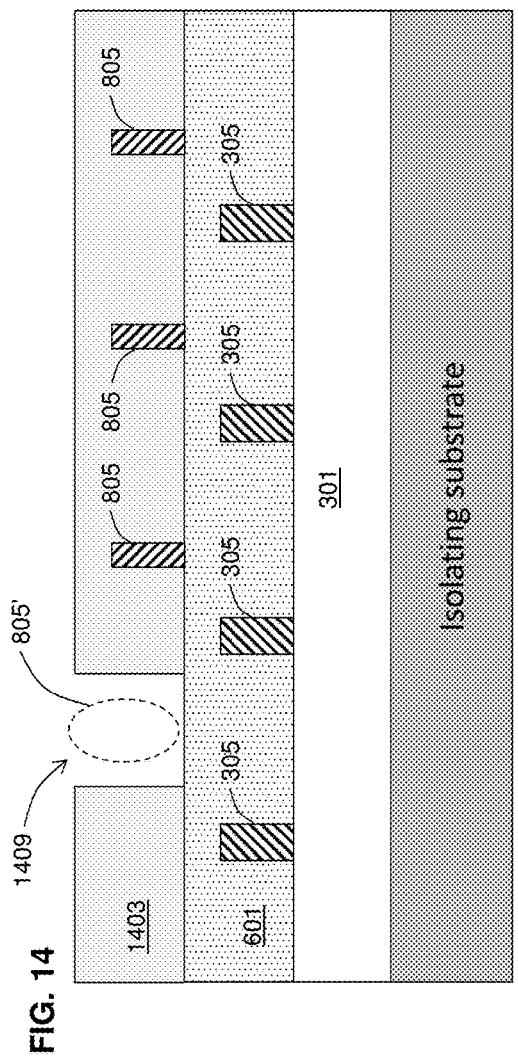
FIG. 14 is a schematic diagram illustrating the trimming of a single second sidewall spacer by a trim mask to leave remaining second sidewall spacers of embodiments herein.

FIG. 14 illustrates a trim mask 1403 that may be used to remove a single second sidewall spacer 805' (dashed oval) from a second sidewall spacer pattern having a double frequency with, for example, an average pitch of 50 nm. Using current photolithographic processes, the trim mask 1403 may protect the second sidewall spacer pattern, with the exception of a single second sidewall spacer 805' (dashed oval). The trim mask 1403, having a 7 nm overlay error, may readily form a space 1409 separating the single second sidewall spacer 805', which is to be trimmed, from adjacent second sidewall spacers having, for example, an average 50 nm pitch. The single second sidewall spacer 805' may be removed by selective etching through the single space 1409, resulting in a second sidewall spacer pattern from which but a single first sidewall 805' spacer has been removed. The trim mask 1403 may then be removed.

Figure 15:
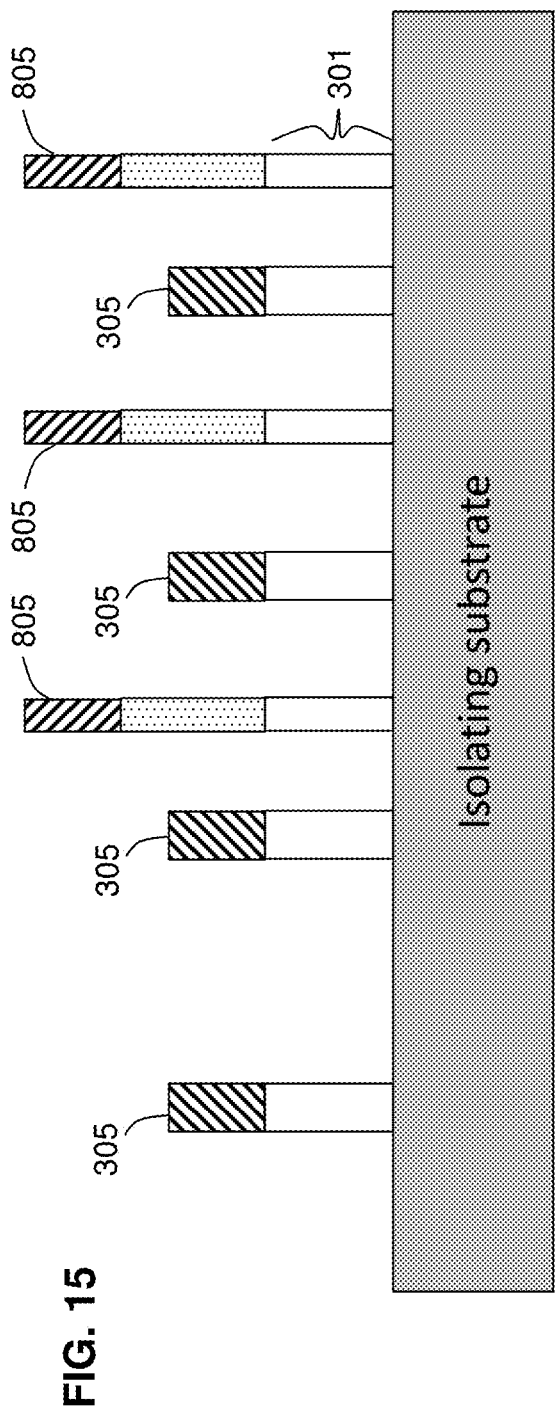
FIG. 15 is a schematic diagram illustrating the selective etching of exposed portions of the protective layer that are not masked by the remaining second sidewall spacers in a first sidewall image transfer and of exposed portions of the semiconductor substrate that are not masked by the first sidewall spacers and the remaining second sidewall spacers in a second sidewall image transfer, to form quadruple frequency fins with single-fin removal of embodiments herein.

Referring to FIG. 15, the protective layer 601 and the semiconductor substrate 301 may be selectively etched using the first and second sidewall spacers 305, 805 of the second material as a mask in two successive sidewall image transfers. The resulting pattern of semiconductor 310 features, masked by the first and second sidewall spacers 305, 805, may form a quadruple frequency of semiconductor 310 features having, for example, an average pitch of 25 nm, from which but one semiconductor feature, corresponding to the single second sidewall spacer 805', has been removed. Thus, the resulting pattern of semiconductor 301 features may comprise a pattern of quadruple frequency fins of FinFETs for a CMOS IC with single-fin removal.

As clearly described above, a single semiconductor 301 feature may be removed from a quadruple frequency pattern of semiconductor 310 features. The particular single semiconductor 301 feature removed may be trimmed from one of: a first pattern of first sidewall spacers 305; and a second pattern of second sidewall spacers 805 that are formed by current photolithography processes using DUV.

The removal of a single fin from a quadruple frequency pattern of fins of FinFETs for a CMOS IC may be to fine tune the number of fins in a circuit. Alternatively, the removal of a single fin from a quadruple frequency pattern of fins may be used to allow a short fin.

Figure 16:
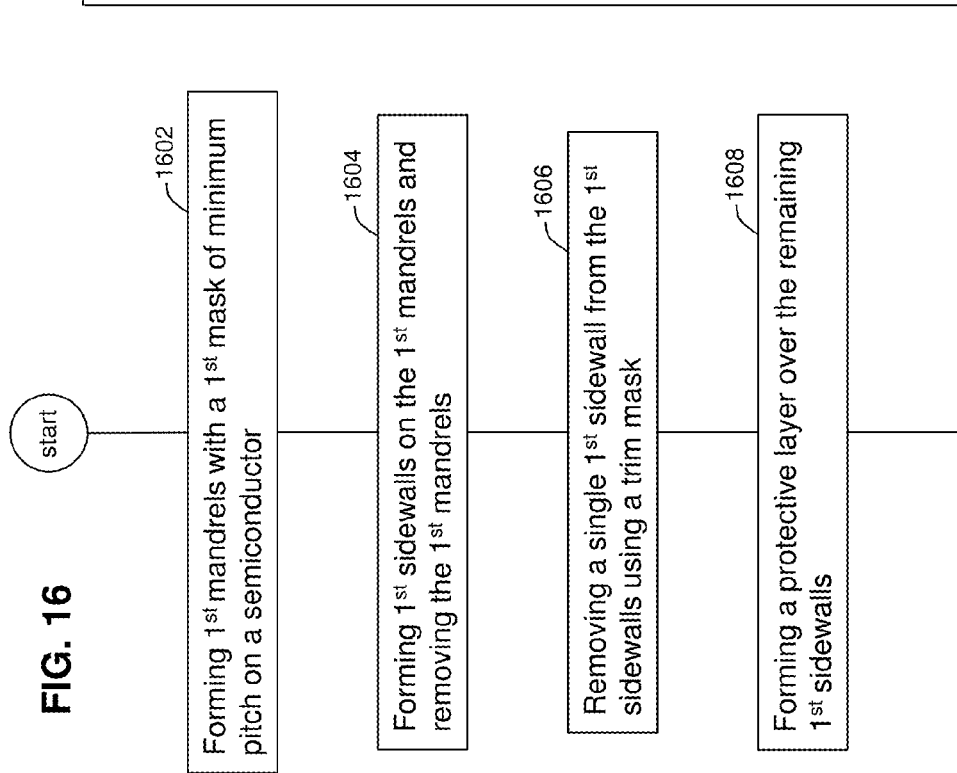
FIG. 16 is a flowchart illustrating a method of forming quadruple frequency fins with single-fin removal of embodiments herein.

FIG. 16 is a flowchart illustrating a method of forming quadruple frequency fins with single-fin removal. The method may include forming first mandrels with a first mask of a minimum pitch on a semiconductor substrate, 1602. The method may also include forming first sidewall spacers on each side of each of the first mandrels and removing the first mandrels, 1604. The method may further include removing a single first sidewall spacer from the first sidewall spacers by using a trim mask, to leave remaining first sidewall spacers, 1606. The method may yet further include forming a protective layer over the remaining first sidewall spacers, 1608. The method may yet further include forming second mandrels with a second mask of the minimum pitch, whose alignment is shifted relative to the first mask, on the protective layer 1610. The method may yet further include forming second sidewall spacers on each side of each of the second mandrels and removing the second mandrels, 1612. The method may yet further include selectively etching exposed portions of the protective layer that are not masked by the second sidewall spacers in a first sidewall image transfer, 1614. Finally, the method may yet further include selectively etching exposed portions of the semiconductor substrate that are not masked by the remaining first sidewall spacers and by second sidewall spacers in a second sidewall image transfer, to form quadruple frequency fins with single-fin removal, 1616.

Figure 17:
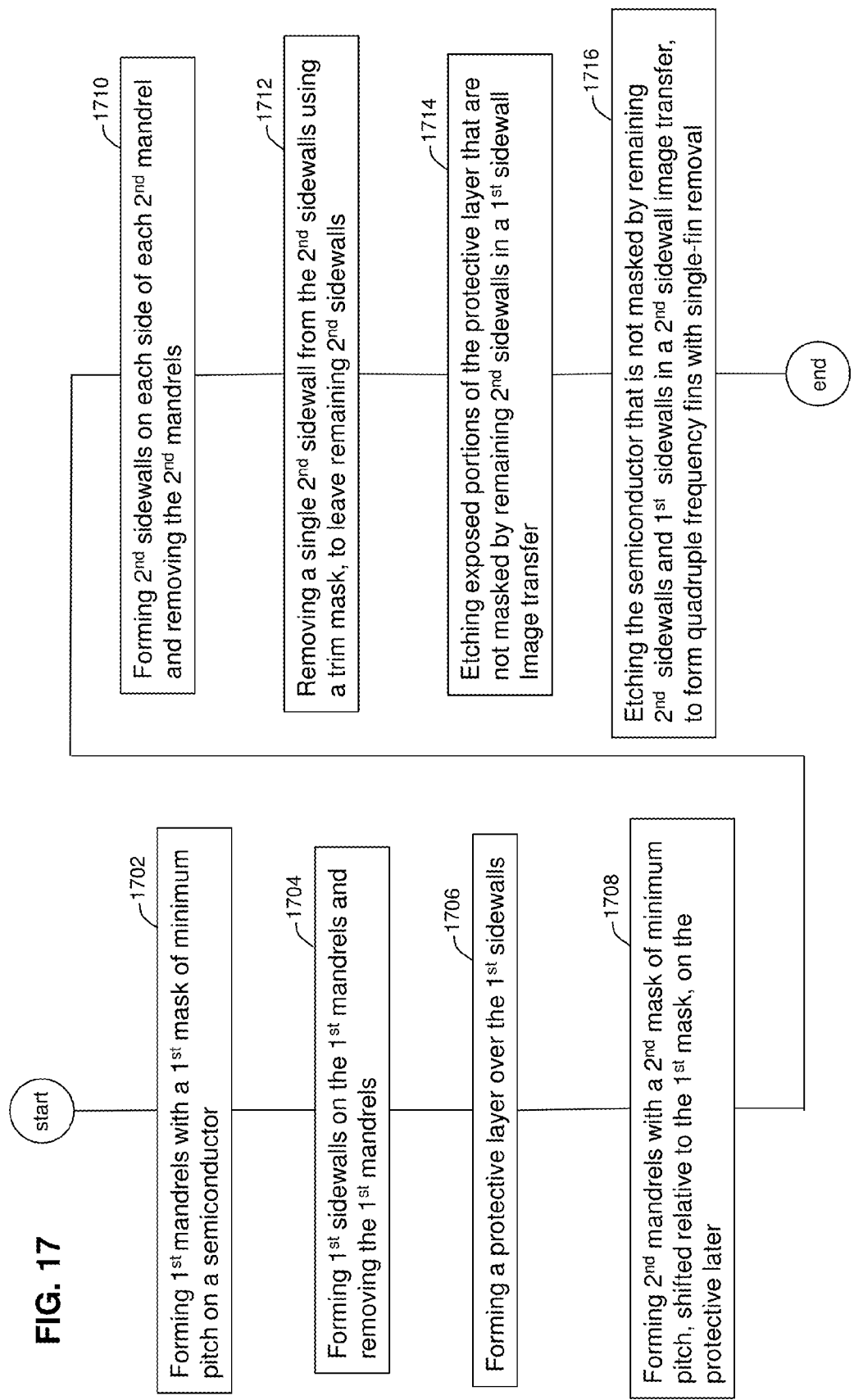
FIG. 17 is a flowchart illustrating another method of forming quadruple frequency fins with single-fin removal of embodiments herein.

FIG. 17 is a flowchart illustrating another method of forming quadruple frequency fins with single-fin removal. The method may include forming first mandrels with a first mask of a minimum pitch on a semiconductor substrate, 1702. The method may also include forming first sidewall spacers on each side of each of the first mandrels and removing the first mandrels, 1704. The method may further include forming a protective layer over the first sidewall spacers, 1706. The method may yet further include forming second mandrels with a second mask of the minimum pitch, whose alignment is shifted relative to the first mask, on the protective layer, 1708. The method may yet further include forming second sidewall spacers on each side of each of the second mandrels and removing the second mandrels, 1710. The method may yet further include removing a single second sidewall spacer from the second sidewall spacers using a trim mask, to leave remaining second sidewall spacers, 1712. The method may yet further include selectively etching exposed portions of the protective layer that are not masked by the remaining second sidewall spacers in a first sidewall image transfer, 1714. Finally, the method may include selectively etching exposed portions of the semiconductor substrate that are not masked by the first sidewall spacers and the remaining second sidewall spacers in a second sidewall image transfer, to form quadruple frequency fins with single-fin removal, 1716.

Figure 18:
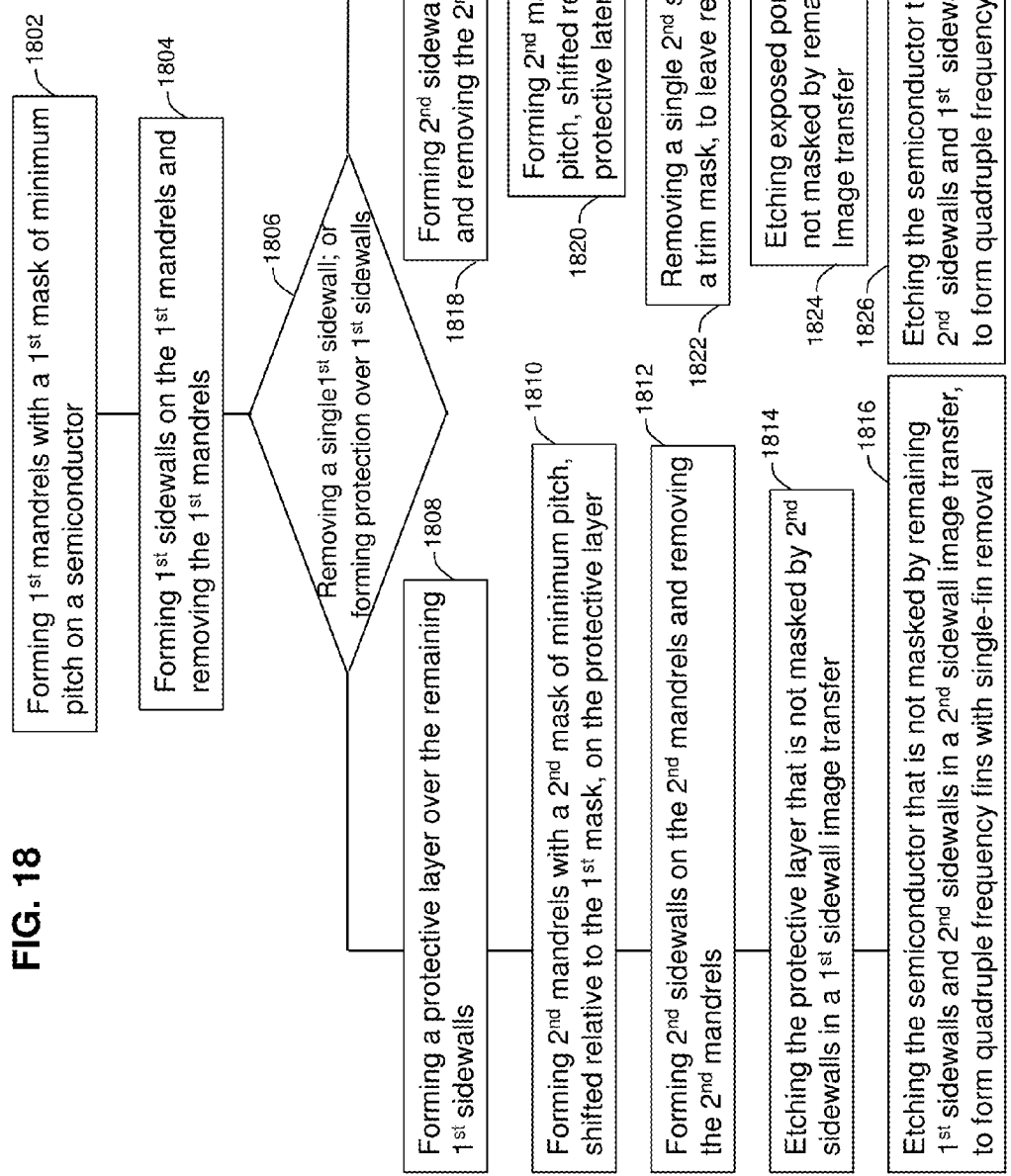
FIG. 18 is a flowchart illustrating yet another method of forming quadruple frequency fins with single-fin removal of embodiments herein.

FIG. 18 is a flowchart illustrating yet another method of forming quadruple frequency fins with single-fin removal. The method may include forming first mandrels with a first mask of a minimum pitch on a semiconductor substrate, 1802. The method may also include forming first sidewall spacers on each side of each of the first mandrels and removing the first mandrels, 1804. The method may further include performing one of: removing a single first sidewall spacer from the first sidewall spacers by a trim mask deposited over the first sidewall spacers to leave remaining first sidewall spacers, and forming a protective layer over the first sidewall spacers, 1806. If the method requires that the single first sidewall spacer be removed, then the method may yet further include: forming a protective layer over the remaining first sidewall spacers, 1808; forming second mandrels with a second mask of the minimum pitch, whose alignment is shifted relative to the first mask, on the protective layer, 1810; forming second sidewall spacers on each side of each of the second mandrels and removing the second mandrels, 1812; selectively etching exposed portions of the protective layer that are not masked by the second sidewall spacers in a first sidewall image transfer, 1814; and selectively etching exposed portions of the semiconductor substrate that are not masked by the remaining first sidewall spacers and the second sidewall spacers in a second sidewall image transfer, to form quadruple frequency fins with single-fin removal, 1816. If the method requires that protective layer be formed over the first sidewall spacers, then the method may yet further include: forming second mandrels with a second mask of the minimum pitch, whose alignment is shifted relative to the first mask, on the protective layer, 1818; forming second sidewall spacers on each side of each of the second mandrels and removing the second mandrels, 1820; removing a single second sidewall spacer from the second sidewall spacers using a trim mask deposited over the second sidewall spacers, to leave remaining second sidewall spacers, 1822; selectively etching exposed portions of the protective layer that are not masked by the remaining second sidewall spacers in a first sidewall image transfer, 1824; and selectively etching exposed portions of the semiconductor substrate that are not masked by the first sidewall spacers and the remaining second sidewall spacers in a second sidewall image transfer, to form quadruple frequency fins with single-fin removal, 1826.

The method as described above is used in the fabrication of integrated circuit chips.

The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

A hardmask can be formed of any suitable material, whether now known or developed in the future, such as a metal or organic hardmask, that has a hardness greater than the substrate and insulator materials used in the remainder of the structure.

When patterning any material herein, the material to be patterned can be grown or deposited in any known manner and a patterning layer (such as an organic photoresist) can be formed over the material. The patterning layer (resist) can be exposed to some pattern of light radiation (e.g., patterned exposure, laser exposure, etc.) provided in a light exposure pattern, and then the resist is developed using a chemical agent. This process changes the physical characteristics of the portion of the resist that was exposed to the light. Then one portion of the resist can be rinsed off, leaving the other portion of the resist to protect the material to be patterned (which portion of the resist that is rinsed off depends upon whether the resist is a positive resist (illuminated portions remain) or negative resist (illuminated portions are rinsed off). A material removal process is then performed (e.g., plasma etching, etc.) to remove the unprotected portions of the material below the resist to be patterned. The resist is subsequently removed to leave the underlying material patterned according to the light exposure pattern (or a negative image thereof).

For purposes herein, "sidewall spacers" are structures that are well-known to those ordinarily skilled in the art and are generally formed by depositing or growing a conformal insulating layer (such as any of the insulators mentioned above) and then performing a directional etching process (anisotropic) that etches material from horizontal surfaces at a greater rate than its removes material from vertical surfaces, thereby leaving insulating material along the vertical sidewalls of structures. This material left on the vertical sidewalls is referred to as sidewall spacers.

In addition, terms such as "right", "left", "vertical", "horizontal", "top", "bottom", "upper", "lower", "under", "below", "underlying", "over", "overlying", "parallel", "perpendicular", etc., used herein are understood to be relative locations as they are oriented and illustrated in the drawings (unless otherwise indicated). Terms such as "touching", "on", "in direct contact", "abutting", "directly adjacent to", etc., mean that at least one element physically contacts another element (without other elements separating the described elements).

The terminology used herein is for the purpose of describing particular embodiments only and is not intended to be limiting of this disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method comprising:
forming first mandrels with a first mask of a minimum pitch, characterized by a photolithographic process using deep ultraviolet (DUV), on a semiconductor substrate;
forming first sidewall spacers on each side of each of said first mandrels and removing said first mandrels, said first sidewall spacers having a double frequency beyond the limits of said minimum pitch of said photolithographic process using DUV;
removing a single first sidewall spacer from said first sidewall spacers by using a trim mask deposited over said first sidewall spacers, to leave remaining first sidewall spacers;
forming a protective layer over said remaining first sidewall spacers;
forming second mandrels with a second mask of said minimum pitch, characterized by said photolithographic process using DUV, whose alignment is shifted laterally relative to said first mask, on said protective layer;
forming second sidewall spacers on each side of each of said second mandrels and removing said second mandrels, said second sidewall spacers having said double frequency beyond the limits of said minimum pitch of said photolithographic process using DUV;
selectively etching exposed portions of said protective layer that are not masked by said second sidewall spacers in a first sidewall image transfer; and
selectively etching exposed portions of said semiconductor substrate that are not masked by said remaining first sidewall spacers and said second sidewall spacers in a second sidewall image transfer, to form quadruple frequency fins of said remaining first sidewall spacers and said second sidewall spacers with but a single-fin that is removed, said single fin-corresponding to said single first sidewall spacer disposed between two adjacent second sidewall spacers.

2. The method of claim 1, further comprising removing said remaining first sidewall spacers, said second sidewall spacers, and said protective layer above said quadruple frequency fins of said remaining first sidewall spacers and said second sidewall spacers.

3. The method of claim 1, said alignment of said second mask relative to said first mask being shifted ½ times said minimum pitch.

4. The method of claim 1, a first material of said first and second mandrels differing and being selectively etched compared to a second material of said first and second sidewall spacers, and a third material of said semiconductor substrate differing and being selectively etched compared to said second material of said first and second sidewall spacers.

5. A method comprising:
forming first mandrels with a first mask of a minimum pitch, characterized by a photolithographic process using deep ultraviolet (DUV), on a semiconductor substrate;
forming first sidewall spacers on each side of each of said first mandrels and removing said first mandrels, said first sidewall spacers having a double frequency beyond the limits of said minimum pitch of said photolithographic process using DUV;
forming a protective layer over said first sidewall spacers;
forming second mandrels with a second mask of said minimum pitch, characterized by a photolithographic process using DUV, whose alignment is shifted laterally relative to said first mask, on said protective layer;
forming second sidewall spacers on each side of each of said second mandrels and removing said second mandrels, said second sidewall spacers having said double frequency beyond the limits of said minimum pitch of said photolithographic process using DUV;
removing a single second sidewall spacer from said second sidewall spacers using a trim mask deposited over said second sidewall spacers, to leave remaining second sidewall spacers;
selectively etching exposed portions of said protective layer that are not masked by said remaining second sidewall spacers in a first sidewall image transfer; and
selectively etching exposed portions of said semiconductor substrate that are not masked by said first sidewall spacers and said remaining second sidewall spacers in a second sidewall image transfer, to form quadruple frequency fins of said remaining first sidewall spacers and said second sidewall spacers with but a single-fin that is removed, said single-fin corresponding to said single second sidewall spacer disposed between two adjacent first sidewall spacers.

6. The method of claim 5, further comprising removing said first sidewall spacers, said remaining second sidewall spacers, and said protective layer above said quadruple frequency fins of said remaining first sidewall spacers and said second sidewall spacers.

7. The method of claim 5, said alignment of said second mask relative to said first mask being shifted ½ times said minimum pitch.

8. The method of claim 5, a first material of said first and second mandrels differing and being selectively etched compared to a second material of said first and second sidewall spacers, and a third material of said semiconductor substrate differing and being selectively etched compared to said second material of said first and second sidewall spacers.

9. A method comprising:
forming first mandrels with a first mask of a minimum pitch, characterized by a photolithographic process using deep ultraviolet (DUV), on a semiconductor substrate;
forming first sidewall spacers on each side of each of said first mandrels and removing said first mandrels, said first sidewall spacers having a double frequency beyond the limits of said minimum pitch of said photolithographic process using DUV;
performing one of: removing a single first sidewall spacer from said first sidewall spacers by a trim mask deposited over said first sidewall spacers to leave remaining first sidewall spacers, and forming a protective layer over said first sidewall spacers;
if said single first sidewall spacer is removed, then:
forming a protective layer over said remaining first sidewall spacers;
forming second mandrels with a second mask of said minimum pitch, characterized by a photolithographic process using DUV, whose alignment is laterally shifted relative to said first mask, on said protective layer;
forming second sidewall spacers on each side of each of said second mandrels and removing said second mandrels, said second sidewall spacers having said double frequency beyond the limits of said minimum pitch of said photolithographic process using DUV;

selectively etching exposed portions of said protective layer that are not masked by said second sidewall spacers in a first sidewall image transfer; and selectively etching exposed portions of said semiconductor substrate that are not masked by said remaining first sidewall spacers and said second sidewall spacers in a second sidewall image transfer, to form quadruple frequency fins of said remaining first sidewall spacers and said second sidewall spacers with but a single-fin that is removed, said single-fin corresponding to said single first sidewall spacer disposed between two adjacent second sidewall spacers; and if said single first sidewall spacer is not removed and said protective layer is formed over said first sidewall spacers, then:

forming second mandrels with a second mask of said minimum pitch, characterized by a photolithographic process using DUV, whose alignment is shifted laterally relative to said first mask, on said protective layer;

forming second sidewall spacers on each side of each of said second mandrels and removing said second mandrels, said second sidewall spacers having said double frequency beyond the limits of said minimum pitch of said photolithographic process using DUV;

removing a single second sidewall spacer from said second sidewall spacers using a trim mask deposited over said second sidewall spacers, to leave remaining second sidewall spacers;

selectively etching exposed portions of said protective layer that are not masked by said remaining second sidewall spacers in a first sidewall image transfer; and selectively etching exposed portions of said semiconductor substrate that are not masked by said first sidewall spacers and said remaining second sidewall spacers in a second sidewall image transfer, to form quadruple frequency fins of said remaining first sidewall spacers and said second sidewall spacers with but a single-fin that is removed, said single-fin corresponding to said single second sidewall spacer disposed between two adjacent first sidewall spacers.

10. The method of claim 9, further comprising:

if said single first sidewall spacer is removed, then removing said remaining first sidewall spacers, said second sidewall spacers, and said protective layer above said quadruple frequency fins of said remaining first sidewall spacers and said second sidewall spacers; and if said protective layer is formed over said first sidewall spacers, then removing said first sidewall spacers, said remaining second sidewall spacers, and said protective layer above said fins.

11. The method of claim 9, said alignment of said second mask relative to said first mask being shifted ½ times said minimum pitch.

12. The method of claim 9, an etch stop layer being deposited on said semiconductor substrate and under said first mandrels and said first sidewall spacers.

13. The method of claim 9, a first material of said first and second mandrels differing and being selectively etched compared to a second material of said first and second sidewall spacers, and a third material of said semiconductor substrate differing and being selectively etched compared to said second material of said first and second sidewall spacers.

* * * * *